(12) United States Patent
Chen

(10) Patent No.: US 12,206,151 B2
(45) Date of Patent: Jan. 21, 2025

(54) COAXIAL ISOLATOR

(71) Applicant: EZCONN CORPORATION, New Taipei (TW)

(72) Inventor: Ming-Ching Chen, New Taipei (TW)

(73) Assignee: EZCONN CORPORATION, New Taipei (TW)

( * ) Notice: Subject to any disclaimer, the term of this patent is extended or adjusted under 35 U.S.C. 154(b) by 398 days.

(21) Appl. No.: 17/852,600

(22) Filed: Jun. 29, 2022

(65) Prior Publication Data
US 2022/0416389 A1 Dec. 29, 2022

(51) Int. Cl.
*H01P 1/36* (2006.01)
*H01B 11/18* (2006.01)
*H02H 9/04* (2006.01)
*H05K 1/02* (2006.01)

(52) U.S. Cl.
CPC ............ *H01P 1/36* (2013.01); *H01B 11/1895* (2013.01); *H02H 9/04* (2013.01); *H05K 1/0243* (2013.01); *H05K 2201/10015* (2013.01); *H05K 2201/1003* (2013.01)

(58) Field of Classification Search
CPC ......... H01B 11/1895; H01P 1/36; H02H 9/04; H05K 1/0243; H05K 2201/10015; H05K 2201/1003
USPC .................................................. 439/620.03
See application file for complete search history.

(56) References Cited

U.S. PATENT DOCUMENTS

| | | | | |
|---|---|---|---|---|
| 4,987,391 A * | 1/1991 | Kusiak, Jr. | ............. | H03H 7/004 361/111 |
| 6,737,935 B1* | 5/2004 | Shafer | ....................... | H01P 1/20 333/167 |
| 7,094,104 B1* | 8/2006 | Burke | ..................... | H01R 24/42 439/620.01 |
| 7,749,026 B1* | 7/2010 | Li | ....................... | H01R 13/6473 439/620.03 |
| 9,647,394 B2* | 5/2017 | Goebel | ............. | H01R 13/7036 |
| 10,381,702 B2* | 8/2019 | Alkan | ..................... | H01R 24/42 |
| 10,811,749 B2* | 10/2020 | Alkan | ....................... | H01P 1/30 |
| 2003/0090340 A1* | 5/2003 | Chen | ....................... | H01R 24/42 333/175 |
| 2004/0104787 A1* | 6/2004 | Shafer | .................... | H04N 7/102 348/E7.052 |

(Continued)

FOREIGN PATENT DOCUMENTS

WO WO-0171907 A1 * 9/2001 ............. H01R 24/42

*Primary Examiner* — Peter G Leigh
(74) *Attorney, Agent, or Firm* — Min-Lee Teng

(57) ABSTRACT

A coaxial isolator includes an integrated circuit board, a first body and a second body. The integrated circuit board includes a first surface, a second surface, a signal processing circuit extending along a central axis, two first capacitors, two second capacitors, and a first iron core. The first capacitors are located on the first surface and are respectively disposed on both sides of the signal processing circuit. The second capacitors are located on the second surface and are respectively arranged corresponding to the positions of the first capacitors. The first iron core surrounds the signal processing circuit. A first tube portion of the first body surrounds the integrated circuit board, and a first end portion of the first body is used for connecting with an external device. A second end portion of the second body is used for connecting with another external device.

20 Claims, 5 Drawing Sheets

(56) References Cited

U.S. PATENT DOCUMENTS

2011/0248801 A1* 10/2011 Blake .................. H01R 24/54
                                                          333/24 R
2017/0005440 A1* 1/2017 Goebel ................ H01R 24/46
2017/0194685 A1* 7/2017 Alkan .................. H01P 1/202
2019/0348775 A1* 11/2019 Alkan .................. H03H 1/0007

* cited by examiner

COAXIAL ISOLATOR

RELATED APPLICATIONS

This application claims priority to TW Application Ser. No. 110207531, filed on Jun. 29, 2021, which is incorporated herein by reference in its entirety.

TECHNICAL FIELD

The present invention is related to a signal isolator, especially, related to a coaxial isolator which is not only convenient to assemble, but is also capable of achieving the same signal isolation effect without using ring capacitors.

BACKGROUND

The community antenna television system, or CATV for short, receives audio and video program signals from cable TV provider or the telecommunications companies, and transmits signals to the user's terminal via coaxial cables. Generally, cable TV provider and telecommunications companies receive audio and video programs through a variety of receiving antennas, including satellite signals across seven continents, wireless transmission and microwave transmission of TV stations or radio stations. After the headend equipment processes the signals, the signal is transmitted to the user terminal via the cable. As part of the signal transmission process, accessories such as filters or signal amplifiers will be used. Thus, the user does not have to install the receiving antenna and related equipment, a wide selection of TV programs can be viewed at a very affordable price.

Current coaxial isolator is sequentially provided with a first body for receiving the input signal, a signal isolation component, a circuit board, and a second body for outputting the signal in the direction from signals input end to signals output end, wherein the signal isolation component at least includes a ring circuit board surrounding the input signal and a ring capacitor, the signal isolation component is used to remove the abnormal voltage, so that signals flowing into the circuit board are not accompanied by abnormal signals, and the signals flowing into the circuit board are output from the second body. Although ring capacitors can effectively address the problem of uneven impedance matching, they are very expensive. The ring circuit board in signal isolation assemblies is also difficult to manufacture and has the disadvantage of being expensive. Additionally, coaxial isolators using ring capacitors are more complicated to assemble.

Hence, the present invention provides a coaxial isolator for the satisfactory products to solve the problems of prior art.

SUMMARY

The purpose of the present invention is to provide a coaxial isolator that does not require ring capacitors to reduce costs, can be easily assembled, and is capable of achieving the same signal isolation effect as conventional signal isolators.

The present invention provides a coaxial isolator. The coaxial isolator includes an integrated circuit board, a first body, and a second body.

The integrated circuit board extends along a central axis and includes a substrate, two first capacitors, two second capacitors, and a first iron core. The substrate includes a first surface and a second surface disposed oppositely, and a signal processing circuit extending along the central axis. The first capacitors are located on the first surface of the substrate and are respectively arranged on both sides of the signal processing circuit. The second capacitors are located on the second surface of the substrate and are respectively correspond to the positions of the first capacitors. The first iron core surrounds the signal processing circuit and is adjacent to the first capacitors and the second capacitors.

The first body surrounds the central axis and includes a first tube portion and a first end portion connected to each other. The first tube portion surrounds the integrated circuit board. The first end portion is used for connecting with an external device. The signal processing circuit is electrically connected to a first contact element disposed inside the first end portion.

The second body surrounds the central axis and is disposed opposite the first body. The second body includes a second tube portion and a second end portion connected to each other. The second tube portion is connected to the first tube portion. The second end portion is used for connecting with another external device. The signal processing circuit is electrically connected to a second contact element disposed inside the second end portion.

In some embodiments, the coaxial isolator further includes a holder. The holder partially surrounds the integrated circuit board and includes a first half portion and a second half portion. Each of the first capacitors has a first plane parallel to the first surface of the substrate. Each of the second capacitors has a second plane parallel to the second surface of the substrate. Wherein an inner wall surface of the first half portion of the holder cooperates with the first plane of the first capacitor to define a first distance, and an inner wall surface of the second half portion of the holder cooperates with the second plane of the second capacitor to define the first distance.

In some embodiments, the first distance is ranging from 0.1 mm to 1.6 mm.

In some embodiments, each of the first capacitors has a first side surface perpendicular to the first plane, each of the second capacitors has a second side surface perpendicular to the second plane, the inner wall surface of the first half portion of the holder cooperates with the first side plane of the first capacitor to define a second distance, and the inner wall surface of the second half portion of the holder cooperates with the second side plane of the second capacitor to define the second distance.

In some embodiments, the coaxial isolator further includes a holder. The holder partially surrounds the integrated circuit board. The holder includes a first half portion and a second half portion. Each of the first capacitors has a first side plane perpendicular to the first surface of the substrate. Each of the second capacitors has a second side plane perpendicular to the second surface of the substrate. Wherein an inner wall surface of the first half portion of the holder cooperates with the first side plane of the first capacitor to define a second distance, and an inner wall surface of the second half portion of the holder cooperates with the second side plane of the second capacitor to define the second distance.

In some embodiments, the second distance is ranging from 0.1 mm to 1.6 mm.

In some embodiments, the integrated circuit board includes two third capacitors and two fourth capacitors, the third capacitors are located on the first surface of the substrate and respectively disposed symmetrically with the first capacitors, the fourth capacitors are located on the second surface of the substrate and respectively correspond to the positions of the third capacitors, the first iron core is arranged between the first capacitors and the third capacitors.

In some embodiments, the coaxial isolator further includes a holder. The holder partially surrounds the integrated circuit board, the holder includes a first half portion and a second half portion. Each of the third capacitors has a third plane. Each of the fourth capacitors has a fourth plane. Wherein an inner wall surface of the first half portion of the holder cooperates with the third plane of the third capacitor to define a first distance, and an inner wall surface of the second half portion of the holder cooperates with the fourth plane of the fourth capacitor to define the first distance.

In some embodiments, the integrated circuit board further includes an accommodation space, the accommodation space penetrates through the first surface and the second surface of the substrate, the accommodation space is used for accommodating the first iron core.

In some embodiments, the integrated circuit board further includes two third capacitors and two fourth capacitors, the third capacitors are located on the first surface of the substrate and respectively disposed symmetrically with the first capacitors, the fourth capacitors are located on the second surface of the substrate and respectively correspond to the positions of the third capacitors, the accommodation space is arranged between the first capacitors and the third capacitors.

In some embodiments, the integrated circuit board further includes a coaxial cable, the signal processing circuit is located in the coaxial cable.

In some embodiments, the integrated circuit board further includes a first connection point and a second connection point arranged at intervals, the first connection point is electrically connected with the first contact element, two ends of the coaxial cable are respectively in electrical contact with the second connection point and the second contact element.

In some embodiments, the coaxial isolator further includes a holder. The holder surrounds the central axis and is sleeved inside the first tube portion. The holder includes a surrounding wall and two slots. Each of the slots extends from one end of the surrounding wall toward the other end, the slots are used for accommodating two side portions of the substrate.

In some embodiments, the side portions of the substrate are fixed to the slots of the holder by welding.

In some embodiments, the integrated circuit board further includes a lightning protection component, the lightning protection component is electrically connected to the first contact element and the signal processing circuit, the lightning protection component is located between the first contact element and the first capacitors.

In some embodiments, the lightning protection component is at least selected from one of the protecting tube, choke, and high-pass filter.

In some embodiments, the integrated circuit board further includes a second iron core, the second iron core surrounds the signal processing circuit, the second iron cord is disposed between the first iron core and the second contact element.

In some embodiments, the coaxial isolator further includes a holder. The holder partially surrounds the integrated circuit board. The holder includes a first half portion and a second half portion. Each of the first capacitors has a first plane. Each of the second capacitors has a second plane. Wherein an inner wall surface of the first half portion of the holder cooperates with the first plane of the first capacitor to define a first distance, and an inner wall surface of the second half portion of the holder cooperates with the second plane of the second capacitor to define the first distance.

BRIEF DESCRIPTION OF THE DRAWINGS

Unless specified otherwise, the accompanying drawings illustrate aspects of the innovative subject matter described herein. Referring to the drawings, wherein like reference numerals indicate similar parts throughout the several views, several examples of coaxial isolator incorporating aspects of the presently disclosed principles are illustrated by way of example, and not by way of limitation.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings but are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

Figure 1:
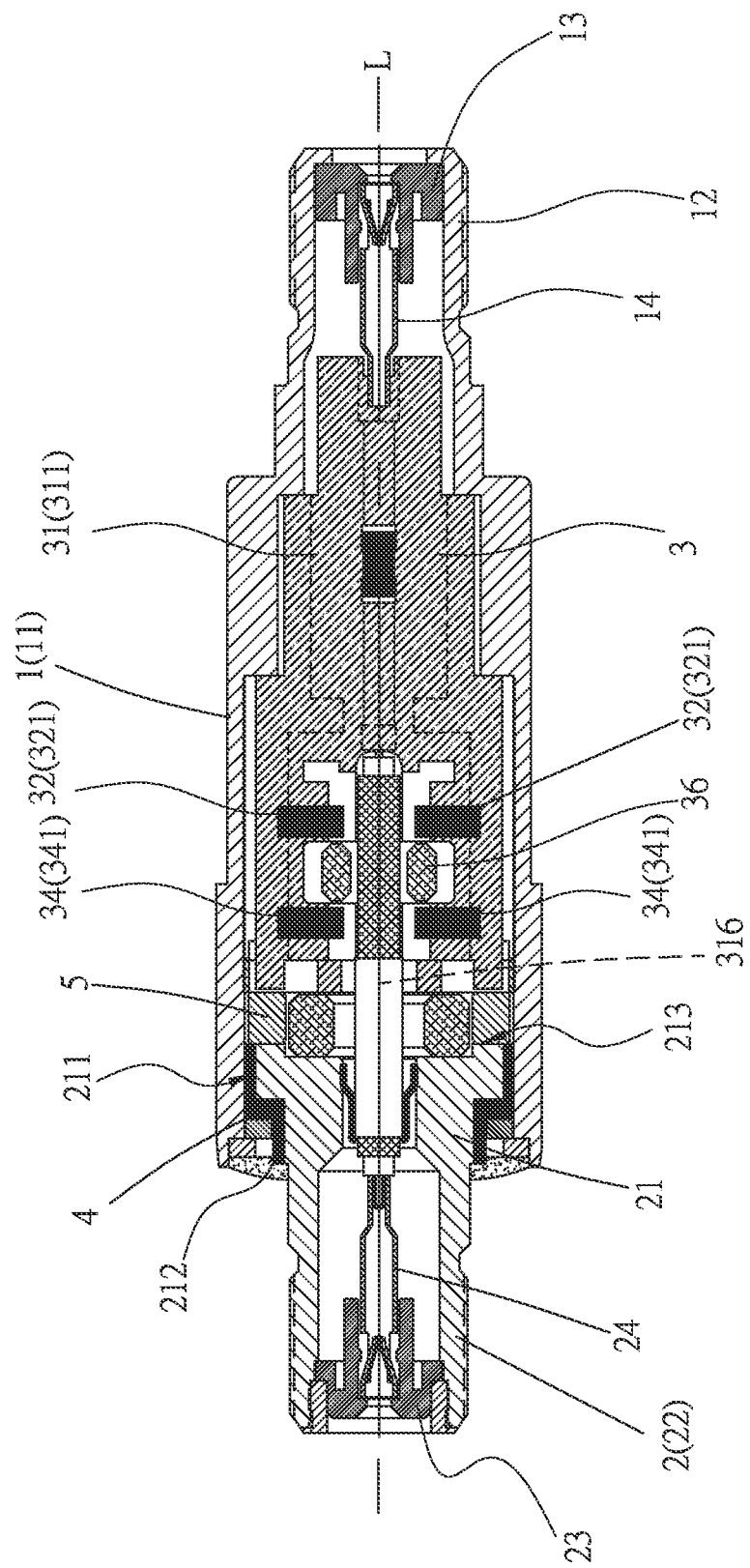
FIG. 1 depicts a cross-sectional view of an embodiment of a coaxial isolator of the present invention, illustrating two first capacitors are arranged on a first surface of a substrate.
Figure 2:
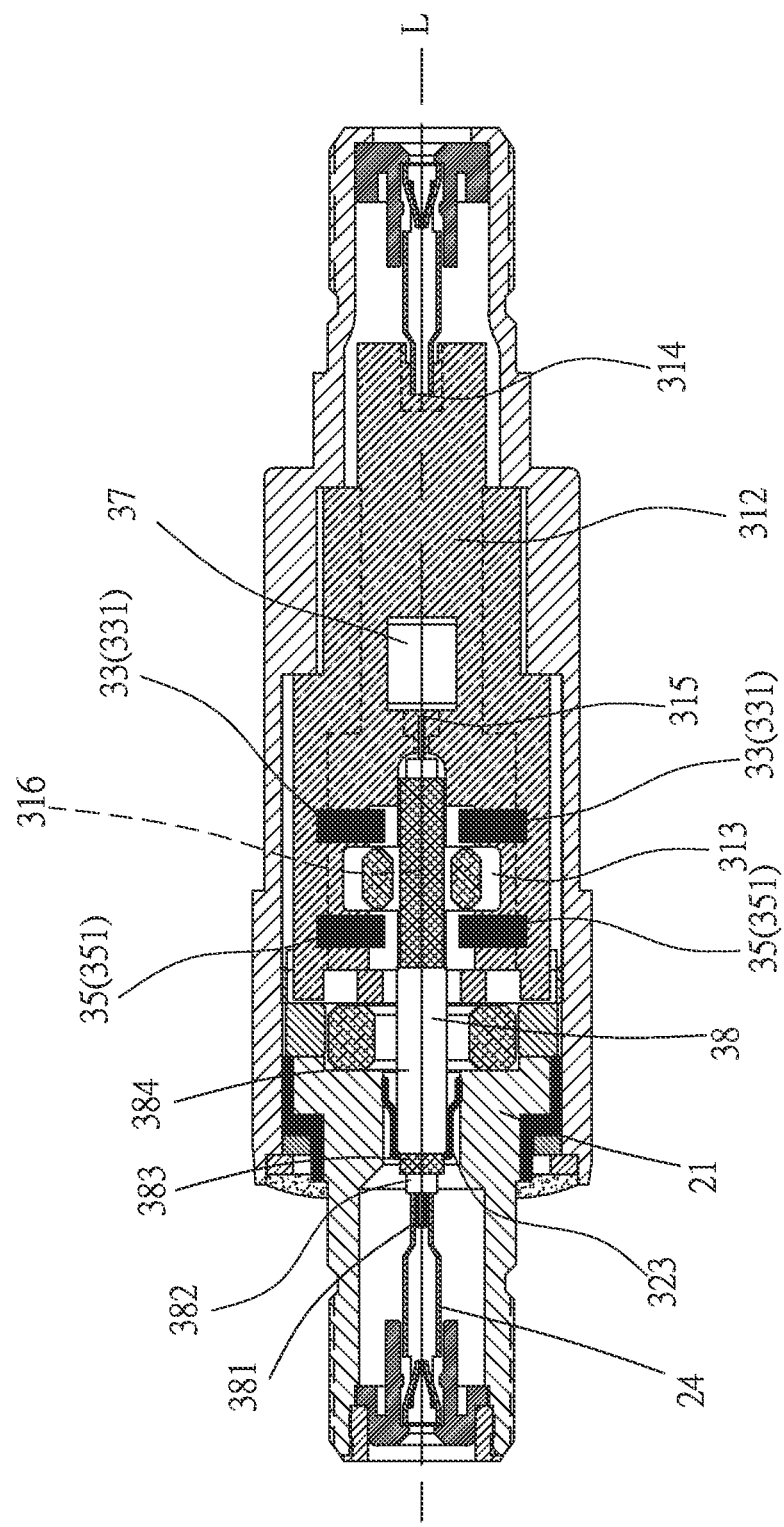
FIG. 2 depicts a cross-sectional view of the embodiment from a different perspective, illustrating two second capacitors are arranged on a second surface of the substrate.
Figure 3:
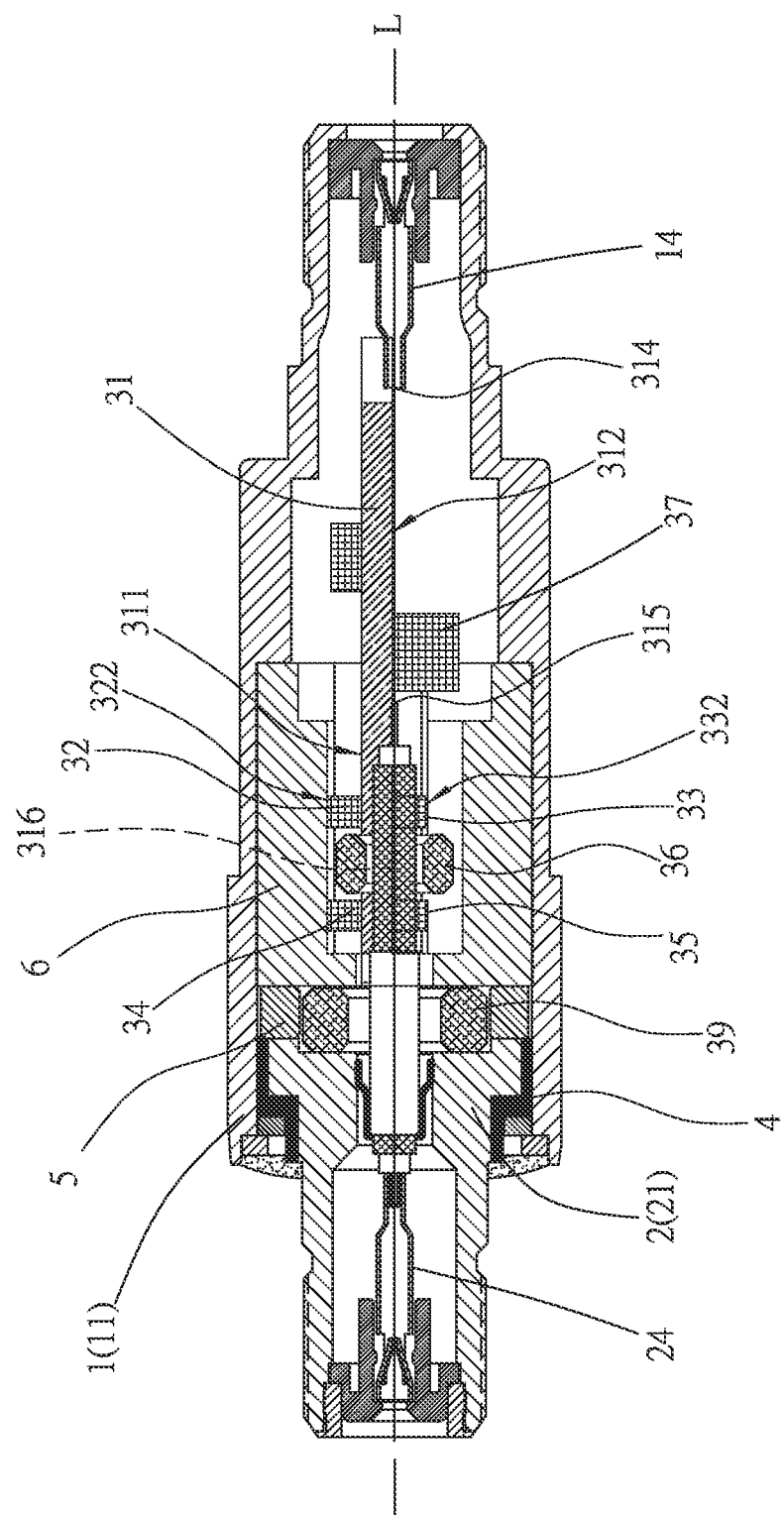
FIG. 3 depicts a cross-sectional view of the embodiment from another perspective, illustrating the first capacitors and the second capacitors are arranged on the first surface and the second surface of the substrate, respectively.
Figure 4:
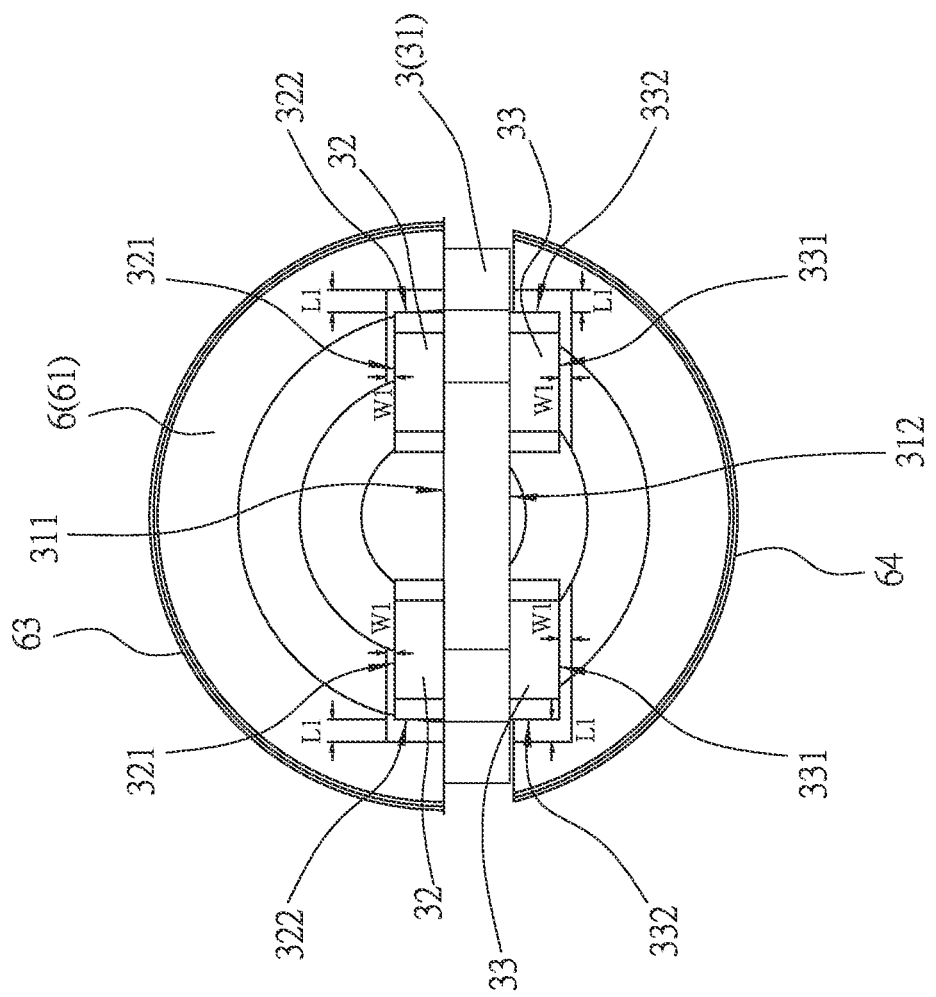
FIG. 4 depicts a front view of the embodiment.

FIG. 1 depicts a cross-sectional view of an embodiment of a coaxial isolator of the present invention, illustrating two first capacitors are arranged on a first surface of a substrate. FIG. 2 depicts a cross-sectional view of the embodiment from a different perspective, illustrating two second capacitors are arranged on a second surface of the substrate. FIG. 3 depicts a cross-sectional view of the embodiment from another perspective, illustrating the first capacitors and the second capacitors are arranged on the first surface and the second surface of the substrate, respectively. FIG. 4 depicts a front view of the embodiment.

Referring to FIGS. 1 to 4, an embodiment of coaxial isolator of the present invention is illustrated. In this embodiment, the coaxial isolator includes a first body 1 and a second body 2, an integrated circuit board 3, a sleeve 4, a spacer 5, and a holder 6, wherein the first body 1 and the second body are arranged oppositely and both surround a central axis L. The materials of the first body 1, the second body 2, and the holder 6 are conductive materials such as copper, iron, silver, nickel, gold, copper-gold alloy, copper-tin alloy, copper-nickel alloy, or other polymers or non-metallic conductors with good conductivity. The materials of the sleeve 4 and the spacer 5 are non-conductive materials such as plastic.

The first body 1 surrounds the central axis L, and the first body 1 includes a first tube portion 11 and a first end portion 12 connected to each other. The first tube portion 11 surrounds the integrated circuit board 3. The first end portion 12 is used for connecting with an external device (not shown). A first insulation element 13 and a first contact element 14 are arranged in the first end portion 12. The material of the first insulation member 13 is insulator, such as plastic or rubber. The material of the first contact element 14 is a conductor, such as copper. The outer peripheral surface of the first insulation element 13 is connected to the inner peripheral surface of the first end portion 12, the interior of the first insulating element 13 accommodates one end of the first contact element 14, and the other end of the first contact element 14 is connected to the integrated circuit plate 3.

The second body 2 includes a second tube portion 21 and a second end portion 22 connected to each other. In this embodiment, the second tube portion 21 is stepped and has a first annular surface 211 and a second annular surface 212, the second annular surface 212 is located between the second end portion 22 and the first annular surface 211. The sleeve 4 is sleeved on the second tube portion 21, and the inner surface of the sleeve 4 matches the shapes of the first annulus 211 and the second annulus 212. The second tube portion 21 is indirectly connected to the first tube portion 11 by the sleeve 4, wherein the sleeve 4 can be loosely or tightly assembled with the second tube portion 21 and the first tube portion 11 according to design requirements. The spacer 5 is sleeved in the first tube portion 11 and abuts against one end surface 213 of the second tube portion 21. The second end portion 22 is used for connecting with another external device (not shown). A second insulation element 23 and a second contact element 24 are arranged inside the second end portion 22. The material of the insulation element 23 is an insulator, such as plastic or rubber, and the material of the second contact element 24 is a conductor, such as copper. The outer peripheral surface of the second insulation element 23 is connected to the inner peripheral surface of the second end portion 22, and one end of the second contact element 24 is disposed inside the second insulation element 23. Additionally, in this embodiment, the first contact element 14 is shown in a state in which the female end can be inserted. In some embodiments, the first contact element 14 can be designed to penetrate the first insulation element 13 and protrude from the first end portion 12 as required, that is, the male end inserts outward, thereby connecting to an external device. Similarly, the second contact element 24 can also be designed to extend beyond the second end portion 22 as required.

The integrated circuit board 3 extends along the central axis L and includes a substrate 31, two first capacitors 32, two second capacitors 33, two third capacitors 34, two fourth capacitors 35, a first iron core 36, and a lightning protection component 37. The substrate 31 includes a first surface 311 and a second surface 312 arranged oppositely, an accommodation space 313, a first connection point 314 and a second connection point 315 arranged at intervals, and a signal processing circuit 316 extending along the central axis L. The accommodation space 313 penetrates through the first surface 311 and the second surface 312 of the substrate 31, and the accommodation space 313 is located between the first capacitors 32 and the third capacitors 34. The first connection point 314 of the substrate 31 is electrically connected to the first contact element 14, and the second connection point 315 is electrically connected to the second contact element 24.

In this embodiment, the integrated circuit board 3 further includes a coaxial cable 38, the signal processing circuit 316 is in the coaxial cable 38, and the opposite ends of the coaxial cable 38 are electrically connected to the second connection point 315 and the second contact element 24, respectively. The coaxial cable 38 includes a center conductor 381, an insulating layer 382, a shielding layer (not shown), a braided layer 383, and a plastic jacket 384 sequentially from the inside to the outside in the radial direction, wherein the material of the center conductor 381 is copper, iron, silver, nickel, gold, copper-gold alloy, copper-tin alloy, copper-nickel alloy or other polymer or non-metallic conductors with good conductivity, etc. The material of the braided layer 383 is a metal layer containing aluminum, a metal layer containing copper, or a conductive layer containing conductive materials, such as an aluminum foil coating layer or a copper foil coating layer, in which the braided layer 383 has an electrical shielding effect which can reduce interference. The form of the braid layer 383 includes different covering forms such as two-layer weaving (Standard), three-layer weaving (Tri-shield) and four-layer weaving (Quad). Additionally, a grounding spring 323 is disposed between the coaxial cable 38 and the second tube portion 21. The grounding spring 323 has one end in contact with the braided layer 383 and the other end in contact with the second tube portion 21. Therefore, the good contact between the three provides good electrical connection, thereby ensuring good signal transmission quality, where the electrical connection is ground.

The first capacitors 32 are located on the first surface 311 of the substrate 31 and are respectively disposed on both sides of the signal processing circuit 316. Each of the first capacitors 32 has a first plane 321 and a first side surface 322, wherein the first planes 321 are parallel to the first surface 311, and the first plane 321 is perpendicular to the first side surface 322. The second capacitors 33 are located on the second surface 312 of the substrate 31 and are respectively disposed corresponding to the positions of the first capacitors 32. Each of the second capacitors 33 has a second plane 331 and a second side surface 332. The second planes 331 are parallel to the second surface 312, the second plane 331 is perpendicular to the second side surface 332. The third capacitors 34 are located on the first surface 311 of the substrate 31 and are respectively disposed symmetrically with the first capacitors 32, and the fourth capacitors 35 are located on the second surface 312 of the substrate 31 and respectively disposed corresponding to the positions of the third capacitors 34. In this embodiment, the first capacitors 32, the second capacitors 33, the third capacitors 34, and the fourth capacitors 35 are all in the shape of sheets, and their capacitance values can be selected from, for example, 4700 pF, 5600 pF, or 10000 pF, as required.

The first iron core 36 is accommodated in the accommodation space 313 and surrounds the signal processing circuit 316. The first iron core 36 is located between the first capacitors 32 and the third capacitors 34. In some embodiments, the coaxial isolator of the present invention further includes a second iron core 39, the second iron core 39 surrounds the signal processing circuit 316 and is sleeved in the spacer 5. The second iron core 39 and the first iron core 36 are arranged at intervals. The second iron core 39 is closer to the second tube portion 21 than the first iron core 36.

The lightning protection component 37 is electrically connected to the first contact element 14 and the signal processing circuit 316, and is located between the first contact element 14 and the first capacitors 32. In this embodiment, the lightning protection component 37 includes at least one of a protecting tube, a choke, and a high-pass filter, or is replaced by other circuit designs that can achieve lightning protection.

Figure 5:
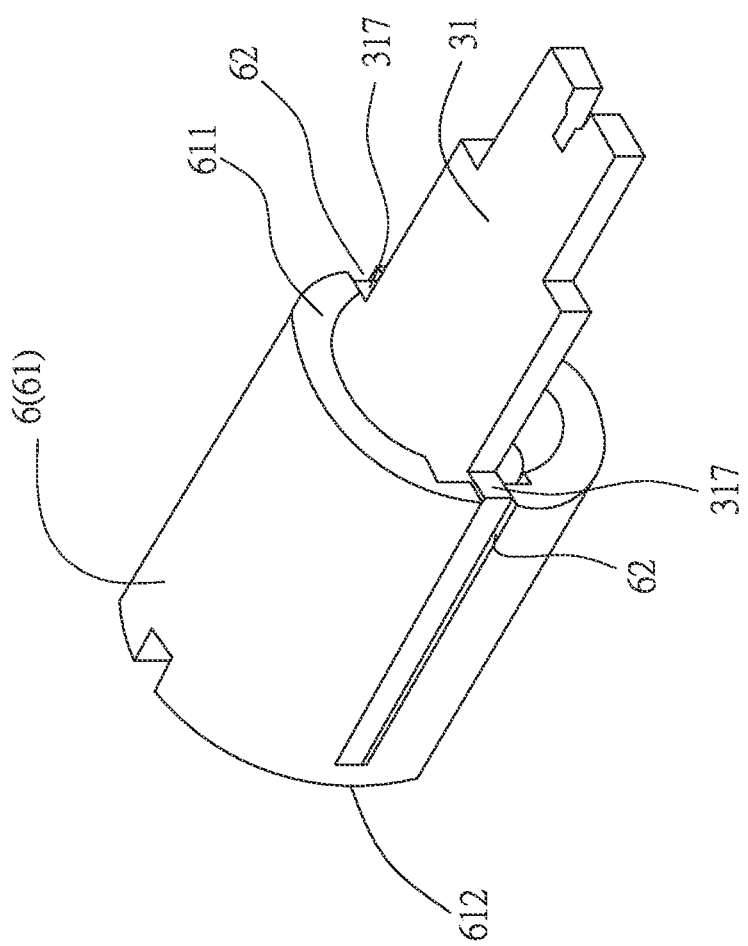
FIG. 5 depicts a perspective view of some components in the embodiment, illustrating an integrated circuit board clamped to two slots of a holder.

FIG. 3 depicts a cross-sectional view of the embodiment from another perspective, illustrating the first capacitors and the second capacitors are arranged on the first surface and the second surface of the substrate, respectively. FIG. 4 depicts a front view of the embodiment. FIG. 5 depicts a perspective view of some components in the embodiment, illustrating an integrated circuit board clamped to two slots of a holder. Referring to FIGS. 3 to 5, the holder 6 surrounds the central axis L and is sleeved in the first tube portion 11 of the first body 1. In this embodiment, the holder 6 partially surrounds the integrated circuit board 3 and includes a surrounding wall 61, two slots 62, a first half portion 63, and a second half portion 64. The slots 62 extend from one end surface 611 of the surrounding wall 61 toward the other end surface 612, and two side portions 317 of the substrate 31 are accommodated in the slots 62. Additionally, the grounding of the first capacitors 32, the second capacitors 33, the third capacitors 34, and the fourth capacitors 35 are connected to the side portions 317 of the substrate 31, and the holder 6 is in contact with the first body 1. Through the good contact between the substrate 31, the holder 6 and the first body 1, the grounding of the capacitors can be grounded reliably to ensure good signal transmission quality. In this embodiment, the first half portion 63 is disposed opposite the second half portion 64. Specifically, the volume of the first half portion 63 is larger than that of the second half portion 64. In some embodiments, the first half portion 63 may be mirror symmetric with the second half portion 64. There is a first distance W1 between the inner wall surface of the first half portion 63 of the holder 6 and each of the first planes 321, and the inner wall surface of the second half portion 64 of the holder 6 is separated from each of the second planes 331 by the first distance W1. Additionally, there is a second distance L1 between the inner wall surface of the first half portion 63 of the holder 6 and each of the first side planes 322, and the inner wall surface of the second half portion 64 of the holder 6 is separated from each of the second side planes 332 by the first distance W1. To achieve a good noise isolation effect, the first distance W1 is ranging between 0.1 mm and 1.6 mm, and the second distance L1 is ranging between 0.1 mm and 1.6 mm. For instance, the first distance is 0.3 mm, while the second distance is 0.55 mm. Preferably, the inner wall of the first half portion 63 has the first distance W1 from a third plane 341 (see FIG. 1) of each of the third capacitors 34, and the inner wall surface of the second half portion 64 has the first distance W1 from a fourth plane 351 (see FIG. 2) of each of the fourth capacitors 35.

FIG. 1 depicts a cross-sectional view of an embodiment of a coaxial isolator of the present invention, illustrating two first capacitors are arranged on a first surface of a substrate. FIG. 2 depicts a cross-sectional view of the embodiment from a different perspective, illustrating two second capacitors are arranged on a second surface of the substrate. FIG. 3 depicts a cross-sectional view of the embodiment from another perspective, illustrating the first capacitors and the second capacitors are arranged on the first surface and the second surface of the substrate, respectively. FIG. 5 depicts a perspective view of some components in the embodiment, illustrating an integrated circuit board clamped to two slots of a holder. Referring to FIGS. 1 to 3 and 5, the assembly process of the coaxial isolator of the present invention, for example, the side portions 317 of the integrated circuit board 3 are inserted first into the slots 62 of the holder 6, wherein the width of the slots 62 is slightly larger than the thickness of the substrate 31, so that the side portions 317 of the substrate 31 can be inserted; after the holder 6 is installed in the first body 1 along with the integrated circuit board 3, and then the spacer 5 and the second iron core 39 surround the signal processing circuit 316; finally, the second body 2, with the sleeve 4, is arranged within the first tube portion 11 of the first body, and then the first body 1 and the second body 2 are connected by potting glue. As long as the purpose of combining the first body 1 and the second body 2 can be achieved, the present invention can also combine them without using glue. The first contact element 14, the signal processing circuit 316, and the second contact element 24 of the coaxial isolator are electrically connected after assembly. In the present invention, the necessary electronic components, such as the first capacitors, the second capacitors, the third capacitors, the fourth capacitors and the lightning protection component, are soldered to the substrate through an automatic reflow oven in advance, and likewise, the coaxial cable with the circuit inside is also soldered automatically. As compared to manually soldering the substrate, it is possible to reduce the time for manufacturing the integrated circuit board in mass.

In the present invention, the external signal input from the first contact element 14 flows through the first connection point 314, the lightning protection component 37, the second connection point 315, and the signal processing circuit 316 sequentially before being output through the contact element 24. The purpose of placing the lightning protection component 37 between the first connection point 314 and the second connection point 315 is to prevent damage to the coaxial isolator of the present invention caused by lightning strikes. The signal processing circuit 316 passes through the central axis L and is surrounded by the first iron core 36; the first capacitors 32 and the second capacitors 33 are disposed on the first surface 311 and the second surface 312 of the substrate 31, respectively; the capacitors are symmetric on both sides of the signal processing circuit 316; and the capacitors used have good grounding effects. With the arrangement of the above-mentioned elements in the mechanism, the coaxial isolator of the present invention achieves the same effect as using ring capacitors to isolate abnormal voltages electrically, thereby ensuring high quality reception.

In some embodiments, such as the transmission of cable television signals, the coaxial isolator of the present invention can be applied both in transmit and receive direction. It is not particularly restricted that the external signal only flows from the first contact element 14 to the second contact element 24. In contrast, the external signal is transmitted from the second contact element 24 to the first contact element 14, also allowing the isolation of abnormal signals to be achieved. In some embodiments, it is measured that the insertion loss value of the present invention is less than −1 dB, and the return loss value is −18 dB, which proves that the present invention is indeed electrically similar to the use of ring capacitors and can solve the radio frequency interference problem.

Based on the above description, the advantages of the coaxial isolator of the present invention can be summarized as follows:

(1) The first capacitors 32, the second capacitors 33, the third capacitors 34, and the fourth capacitors 35 are arranged on both sides of the substrate 31, and the capacitors are symmetrically arranged on both sides of the signal processing circuit 316; the first capacitors 32 and the third capacitors 34 are symmetrically arranged on the first surface 311 of the substrate 31 with the accommodation space 313 as the center, and on the second surface 312 are the second capacitors 33 and the fourth capacitor 35, which correspond to the positions of the first capacitors 32 and the third capacitors 34 respectively; in addition, the first iron core 36 surrounds the signal processing circuit 316 and is disposed on the integrated circuit board 3 passing through the central axis L, achieving the same effect as using ring capacitors to isolate abnormal voltages and eliminating the need for ring capacitors to reduce production costs.

(2) By integrating and soldering electronic components directly onto the substrate 31 of the integrated circuit board 3, assembly steps and time can be reduced, resulting in a more convenient assembly process.

(3) The ground terminals located on the first surface 311 and the second surface 312 of the integrated circuit board 3 are in large-area contact with the slots 62 of the holder 6, and the holder 6 is in contact with the first body 1, so that the coaxial isolator of the invention has good grounding characteristics.

The overall structure of the coaxial isolator of the present invention is simpler, and the capacitor-impedance matching is uniform, as well as the grounding effect, so it can effectively reduce RFI and maintain transmission quality, which can achieve the purpose of the present invention.

The presently disclosed inventive concepts are not intended to be limited to the embodiments shown herein, but are to be accorded their full scope consistent with the principles underlying the disclosed concepts herein. Directions and references to an element, such as "up," "down,", "upper," "lower," "horizontal," "vertical," "left," "right," and the like, do not imply absolute relationships, positions, and/or orientations. Terms of an element, such as "first" and "second" are not literal, but, distinguishing terms. As used herein, terms "comprises" or "comprising" encompass the notions of "including" and "having" and specify the presence of elements, operations, and/or groups or combinations thereof and do not imply preclusion of the presence or addition of one or more other elements, operations and/or groups or combinations thereof. Sequence of operations do not imply absoluteness unless specifically so stated. Reference to an element in the singular, such as by use of the article "a" or "an", is not intended to mean "one and only one" unless specifically so stated, but rather "one or more". As used herein, "and/or" means "and" or "or", as well as "and" and "or." As used herein, ranges and subranges mean all ranges including whole and/or fractional values therein and language which defines or modifies ranges and subranges, such as "at least," "greater than," "less than," "no more than," and the like, mean subranges and/or an upper or lower limit. All structural and functional equivalents to the elements of the various embodiments described throughout the disclosure that are known or later come to be known to those of ordinary skill in the relevant art are intended to be encompassed by the features described and claimed herein. Moreover, nothing disclosed herein is intended to be dedicated to the public regardless of whether such disclosure may ultimately explicitly be recited in the claims. No element or concept disclosed herein or hereafter presented shall be construed under the provisions of 35 USC 112(f) unless the element or concept is expressly recited using the phrase "means for" or "step for".

In view of the many possible embodiments to which the disclosed principles can be applied, we reserve the right to claim any and all combinations of features and acts described herein, including the right to claim all that comes within the scope and spirit of the foregoing description, as well as the combinations recited, literally and equivalently, in the following claims and any claims presented anytime throughout prosecution of this application or any application claiming benefit of or priority from this application.

What is claimed is:

1. A coaxial isolator, including:
    an integrated circuit board, extending along a central axis, including:
        a substrate, including a first surface and a second surface disposed oppositely, and a signal processing circuit extending along the central axis;
        two first capacitors, located on the first surface of the substrate and respectively arranged on both sides of the signal processing circuit;
        two second capacitors, located on the second surface of the substrate and respectively correspond to the positions of the first capacitors; and
        a first iron core, surrounding the signal processing circuit and adjacent to the first capacitors and the second capacitors;
    a first body, surrounding the central axis, including a first tube portion and a first end portion connected to each other, the first tube portion surrounding the integrated circuit board, the first end portion used for connecting with an external device, the signal processing circuit electrically connected to a first contact element disposed inside the first end portion; and
    a second body, surrounding the central axis and disposed opposite the first body, the second body including a second tube portion and a second end portion connected to each other, the second tube portion connected to the first tube portion, the second end portion used for connecting with another external device, the signal processing circuit electrically connected to a second contact element disposed inside the second end portion.

2. The coaxial isolator of claim 1, further including a holder, the holder partially surrounding the integrated circuit board, the holder including a first half portion and a second half portion, each of the first capacitors having a first plane parallel to the first surface of the substrate, each of the second capacitors having a second plane parallel to the second surface of the substrate, wherein an inner wall surface of the first half portion of the holder cooperates with the first plane of the first capacitor to define a first distance, and an inner wall surface of the second half portion of the holder cooperates with the second plane of the second capacitor to define the first distance.

3. The coaxial isolator of claim 2, wherein the first distance is ranging from 0.1 mm to 1.6 mm.

4. The coaxial isolator of claim 2, wherein each of the first capacitors has a first side surface perpendicular to the first plane, each of the second capacitors has a second side surface perpendicular to the second plane, the inner wall surface of the first half portion of the holder cooperates with the first side plane of the first capacitor to define a second distance, and the inner wall surface of the second half portion of the holder cooperates with the second side plane of the second capacitor to define the second distance.

5. The coaxial isolator of claim 1, further including a holder, the holder partially surrounding the integrated circuit board, the holder including a first half portion and a second half portion, each of the first capacitors having a first side plane perpendicular to the first surface of the substrate, each of the second capacitors having a second side plane perpendicular to the second surface of the substrate, wherein an inner wall surface of the first half portion of the holder cooperates with the first side plane of the first capacitor to define a second distance, and an inner wall surface of the second half portion of the holder cooperates with the second side plane of the second capacitor to define the second distance.

6. The coaxial isolator of claim 5, wherein the second distance is ranging from 0.1 mm to 1.6 mm.

7. The coaxial isolator of claim 1, wherein the integrated circuit board includes two third capacitors and two fourth capacitors, the third capacitors are located on the first surface of the substrate and respectively disposed symmetrically with the first capacitors, the fourth capacitors are located on the second surface of the substrate and respectively correspond to the positions of the third capacitors, the first iron core is arranged between the first capacitors and the third capacitors.

8. The coaxial isolator of claim 7, further including a holder, the holder partially surrounding the integrated circuit board, the holder including a first half portion and a second half portion, each of the third capacitors having a third plane, each of the fourth capacitors having a fourth plane, wherein an inner wall surface of the first half portion of the holder cooperates with the third plane of the third capacitor to define a first distance, and an inner wall surface of the second half portion of the holder cooperates with the fourth plane of the fourth capacitor to define the first distance.

9. The coaxial isolator of claim 1, wherein the integrated circuit board further includes an accommodation space, the accommodation space penetrates through the first surface and the second surface of the substrate, the accommodation space is used for accommodating the first iron core.

10. The coaxial isolator of claim 9, wherein the integrated circuit board further includes two third capacitors and two fourth capacitors, the third capacitors are located on the first surface of the substrate and respectively disposed symmetrically with the first capacitors, the fourth capacitors are located on the second surface of the substrate and respectively correspond to the positions of the third capacitors, the accommodation space is arranged between the first capacitors and the third capacitors.

11. The coaxial isolator of claim 1, wherein the integrated circuit board further includes a coaxial cable, the signal processing circuit is located in the coaxial cable.

12. The coaxial isolator of claim 11, wherein the integrated circuit board further includes a first connection point and a second connection point arranged at intervals, the first connection point is electrically connected with the first contact element, two ends of the coaxial cable are respectively in electrical contact with the second connection point and the second contact element.

13. The coaxial isolator of claim 1, further including a holder, the holder surrounding the central axis and sleeved inside the first tube portion, the holder including a surrounding wall and two slots, each of the slots extending from one end of the surrounding wall toward the other end, the slots being used for accommodating two side portions of the substrate.

14. The coaxial isolator of claim 13, wherein the side portions of the substrate are fixed to the slots of the holder by welding.

15. The coaxial isolator of claim 1, wherein the integrated circuit board further includes a lightning protection component, the lightning protection component is electrically connected to the first contact element and the signal processing circuit, the lightning protection component is located between the first contact element and the first capacitors.

16. The coaxial isolator of claim 15, wherein the lightning protection component is at least selected from one of the protecting tube, choke, and high-pass filter.

17. The coaxial isolator of claim 1, wherein the integrated circuit board further includes a second iron core, the second iron core surrounds the signal processing circuit, the second iron cord is disposed between the first iron core and the second contact element.

18. The coaxial isolator of claim 17, further including a holder, the holder surrounding the central axis and sleeved inside the first tube portion, the holder including a surrounding wall and two slots, each of the slots extending from one end of the surrounding wall toward the other end, the slots being used for accommodating two side portions of the substrate.

19. The coaxial isolator of claim 17, further including a holder, the holder partially surrounding the integrated circuit board, the holder including a first half portion and a second half portion, each of the first capacitors having a first plane, each of the second capacitors having a second plane, wherein an inner wall surface of the first half portion of the holder cooperates with the first plane of the first capacitor to define a first distance, and an inner wall surface of the second half portion of the holder cooperates with the second plane of the second capacitor to define the first distance.

20. The coaxial isolator of claim 19, wherein the first distance is ranging from 0.1 mm to 1.6 mm.

* * * * *